United States Patent [19]

Walker et al.

[11] Patent Number: 5,894,153

[45] Date of Patent: Apr. 13, 1999

[54] FIELD IMPLANT FOR SILICON CONTROLLED RECTIFIER

[75] Inventors: John D. Walker, Colorado Springs; Maurice M. Moll; Hoang P. Nguyen, both of Ft. Collins, all of Colo.

[73] Assignees: AT&T Global Information Solutions Company, Dayton, Ohio; Hyundai Electronics America, San Jose, Calif.; Symbios, Inc., Fort Collins, Colo.

[21] Appl. No.: 08/625,986

[22] Filed: Apr. 1, 1996

Related U.S. Application Data

[63] Continuation of application No. 08/369,049, Jan. 5, 1995, abandoned, which is a continuation of application No. 08/129,224, Sep. 29, 1993, abandoned.

[51] Int. Cl.$^6$ .................................................. H01L 23/62
[52] U.S. Cl. ........................ 257/355; 257/356; 257/362
[58] Field of Search ................................ 257/355, 356, 257/357, 360, 361, 362, 577

[56] References Cited

U.S. PATENT DOCUMENTS

| | | | |
|---|---|---|---|
| 5,077,591 | 12/1991 | Chen et al. | 257/362 |
| 5,225,702 | 7/1993 | Chatterjee | 257/355 |
| 5,274,262 | 12/1993 | Avery | 257/577 |
| 5,465,189 | 11/1995 | Polgreen et al. | 361/58 |
| 5,473,169 | 12/1995 | Ker et al. | 257/173 |
| 5,493,133 | 2/1996 | Duvvury et al. | 257/111 |
| 5,506,742 | 4/1996 | Marum | 361/56 |

*Primary Examiner*—Steven H. Loke
*Attorney, Agent, or Firm*—David K. Lucente; Wayne P. Bailey

[57] ABSTRACT

An integrated circuit formed on a semiconductor substrate has a contact pad for communicating signals between an external device and an internal signal line. The pad is protected by an SCR that conducts electrostatic discharge pulses from the pad directly to a current sink. The SCR includes a subregion underneath a field oxide that has a field inplant that increases the dopant concentration. The field implant lowers the SCR trigger voltage, so that SCR triggers before an ESD pulse can cause latch-up or damage in other devices in the integrated circuit.

7 Claims, 19 Drawing Sheets

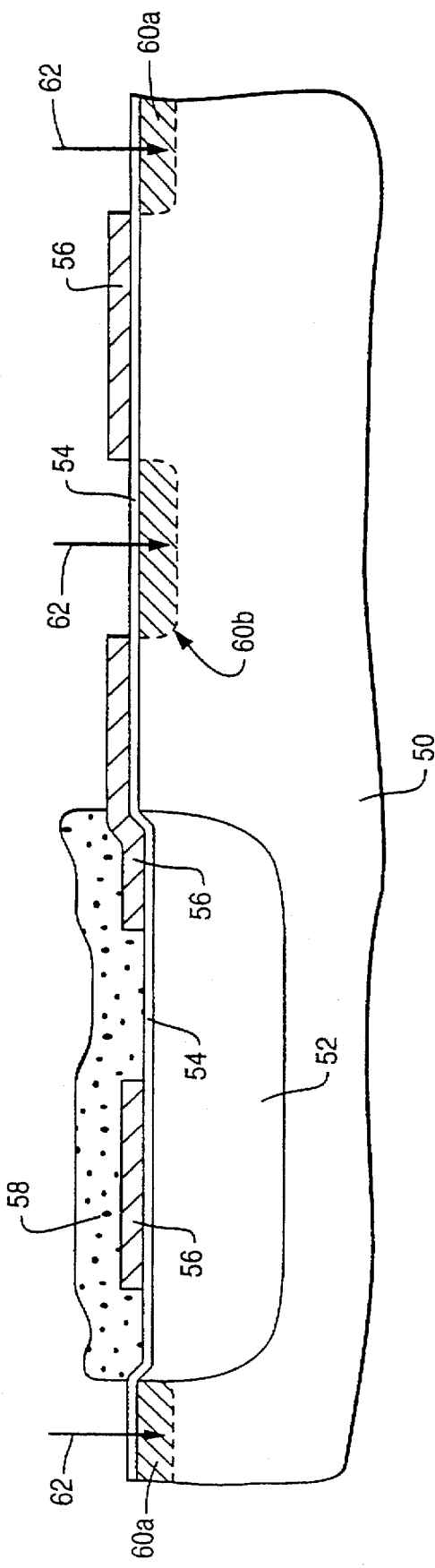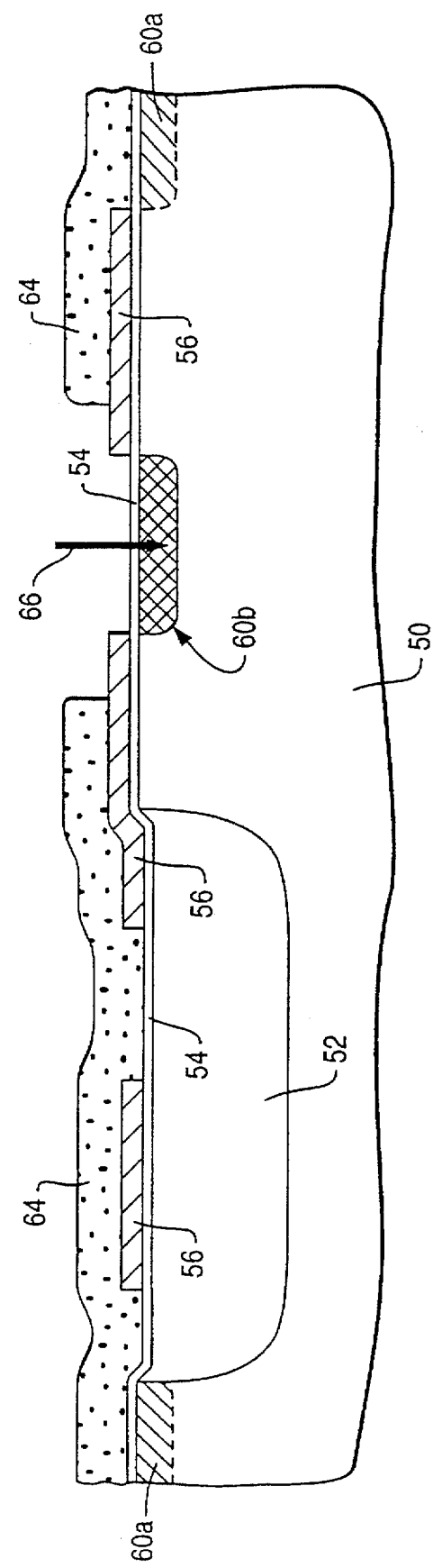

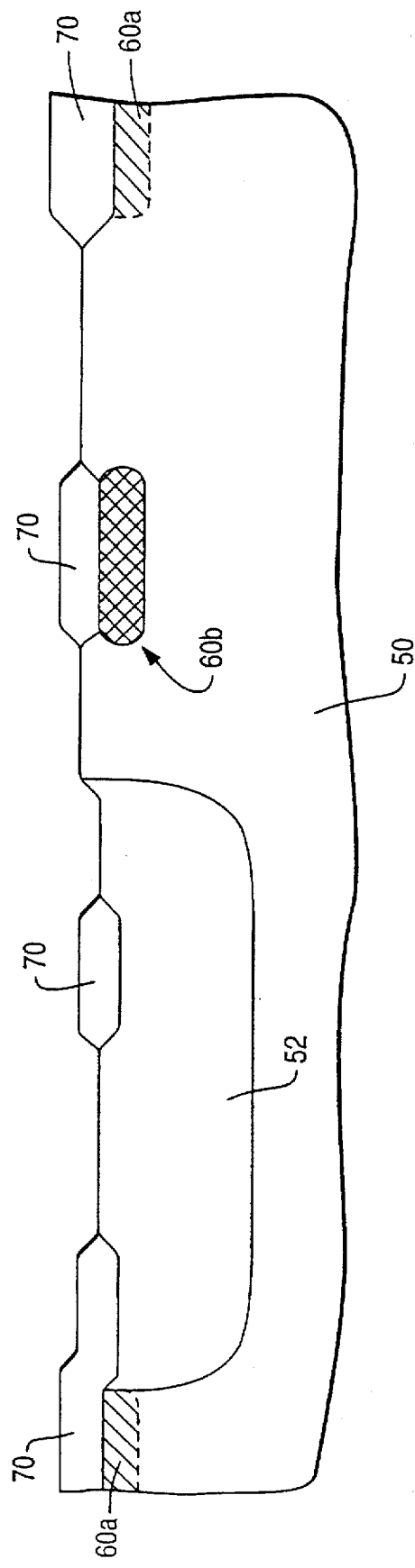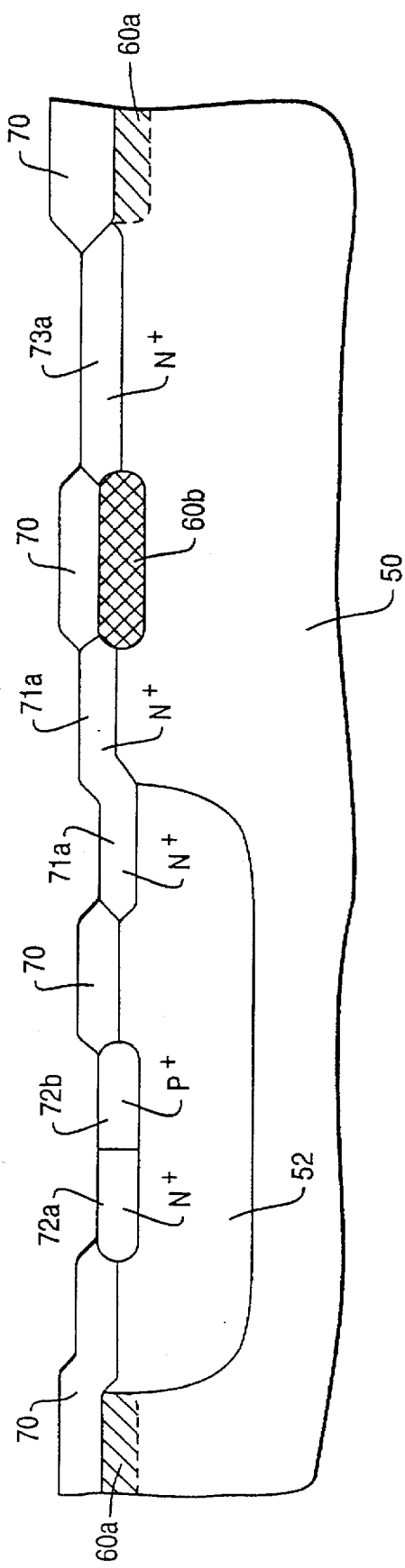

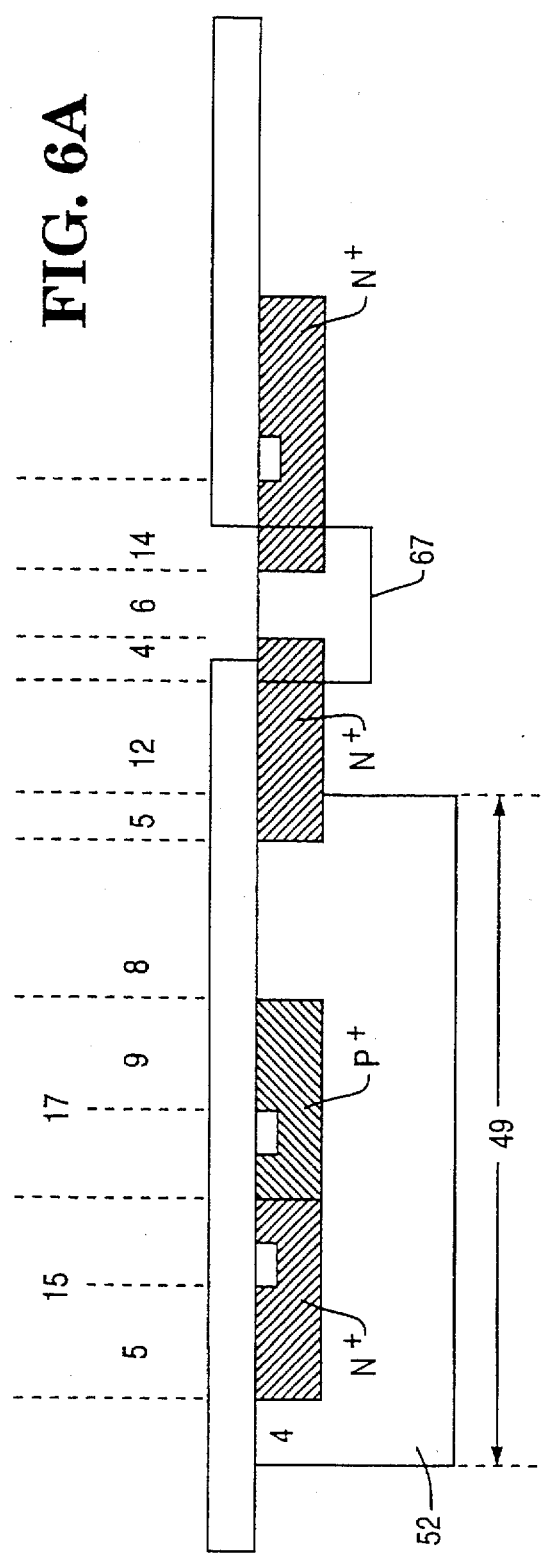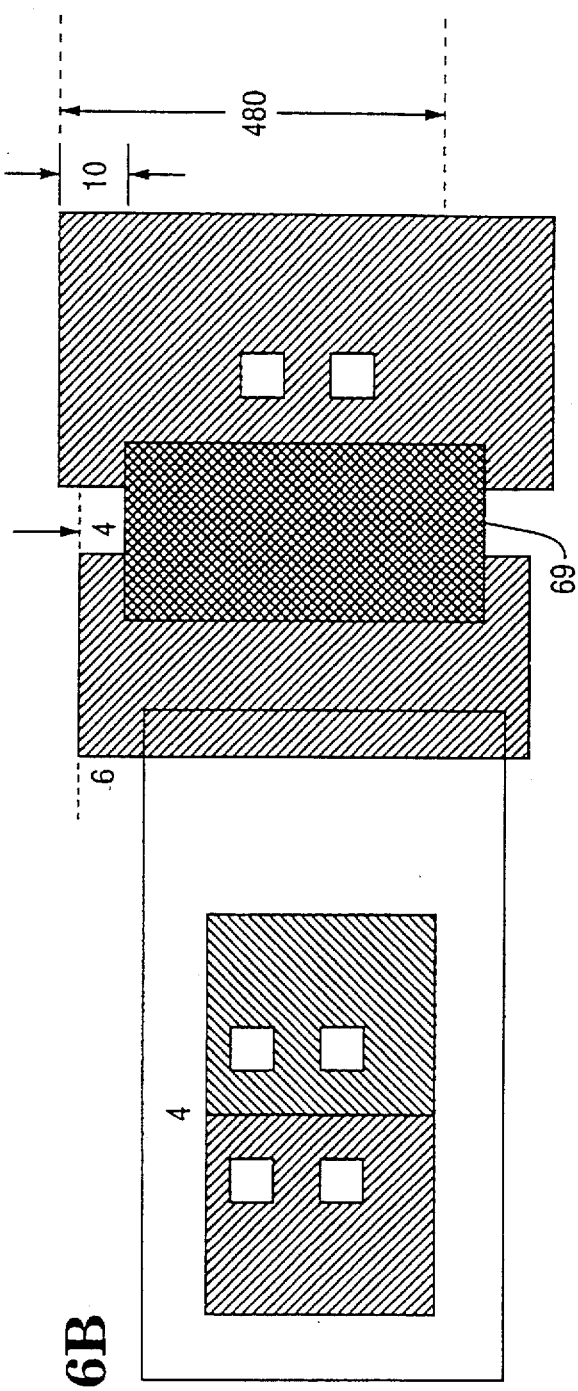

FIG. 9A

| SPLIT | Ib (mA) | PNP | NPN | PRODUCT |
|---|---|---|---|---|
| NO IMPLANT | 5 | 1.88 | 1.80 | 3.384 |
| 5e14/cm**2 | 5 | 2.40 | 1.09 | 2.616 |
| NO IMPLANT | 20 | 0.547 | 0.651 | 0.356 |
| 5e14/cm**2 | 20 | 0.386 | 0.584 | 0.225 |

FIG. 9B

| DOSE | Hfe NPN | Hfe PNP | ITRIGGER | VTRIGGER | IHOLD | VHOLD |
|---|---|---|---|---|---|---|
| NONE | 8.3 | 10.8 | 5.0mA | 71V | 72mA | 1.60V |
| 3E13/cm$^2$ | 8.0 | 11.2 | 8.0mA | 63V | 90mA | 1.64V |

□ WAFER 2, NO IMPLANT
○ WAFER 10, 3E13 (STD)
△ WAFER 18, 1E14
▽ WAFER 24, 5E14

FIG. 15

| PARAMETER | 2E14 IMPLANT | | 3E13 IMPLANT | |
| --- | --- | --- | --- | --- |
| | LEAKAGE (pA) | BREAKDOWN VOLTAGE (V) | LEAKAGE (pA) | BREAKDOWN VOLTAGE (V) |
| MEAN | 1.81 | 10.64 | 0.29 | 15.41 |
| STANDARD DEVIATION | 6.52 | 0.724 | 0.32 | 1.35 |
| MAXIMUM | 34.55 | 12.84 | 1.6 | 18.15 |
| MINIMUM | 0.00 | 9.72 | 0.0 | 12.30 |
| MEDIAN | 0.225 | 10.44 | 0.27 | 15.50 |
| COUNT | 30 | 30 | 30 | 30 |

FIG. 17

| STRUCTURE | TEST VOLTAGE (V) | PINS FAILING / PINS TESTED | PARTS TESTED | % FAILURE RATE |
|---|---|---|---|---|
| WITHOUT SCR AND POLY RESISTOR | 1000 | 8 / 279 | 3 | 2.9 % |
| WITHOUT SCR AND POLY RESISTOR | 1500 | 21 / 279 | 3 | 7.5 % |
| WITHOUT SCR AND POLY RESISTOR | 2000 | 4 / 279 | 3 | 1.4 % |
| WITH SCR AND POLY RESISTOR | 2000 | 0 / 1395 | 15 ( 3 LOTS ) | 0 % |
| WITH SCR AND POLY RESISTOR | 4000 | 2 / 1767 | 19 ( 4 LOTS ) | 0.113 % | ized concentration of dopant in a region under a field oxide. The field implant lowers the SCR trigger voltage so that the SCR activates and shunts ESD energy before the ESD energy can cause permanent damage to the FET devices.

1
FIELD IMPLANT FOR SILICON CONTROLLED RECTIFIER

This is a continuation of application Ser. No. 08/369,049 filed Jan. 5, 1995 now abandoned, which is a continuation of application Ser. No. 08/129,224, filed Sep. 29, 1993, now abandoned.

BACKGROUND

The invention relates to the general field of semiconductor devices, and in particular to a field implant used to adjust operating characteristics of an SCR in an electrostatic discharge protection circuit.

High voltage electrostatic discharge (ESD) can damage fied effect transistor (FET) devices. Various combinations of diodes, transistors and resistors have been suggested to clamp electrostatic voltage excursions to levels below the gate oxide breakdown limits. A technique for reducing susceptibility to latchup is to form the FET devices in an epitaxial layer above a low impedance substrate. Additionally, guard rings and retrograde well dopant concentrations are known.

SUMMARY

An object of the present invention is to provide improved protection for integrated circuits against electrostatic discharge pulses.

Anoth er object is to protect integrated circuits against latch-up of parasitic PNPN regions.

Yet another object is to protect integrated circuits against soft or intermittent failure and permanent damage that might otherwise result from ESD pulses.

Yet another object is to prove improved SED protection with a minimum amount of additional fabrication steps in manufacturing an integrated circuit.

The present invention achieves these objects by forming a silicon controlled rectifier (SCR) between an input/output pad and circuit ground (Vss). The SCR characteristics, such as trigger voltage and holding current, are adjusted by implanting an increased concentration of dopant in a region under a field oxide. The field implant lowers the SCR trigger voltage so that the SCR activates and shunts ESD energy before the ESD energy can cause permanent damage to the FET devices.

BRIEF DESCRIPTION OF THE DRAWINGS

The invention will be described below with reference to attached drawings in which:

FIGS. 4a–4g illustrate cross sections of an integrated circuit SCR used in the circuits of FIGS. 2 and 3 at various points in the fabrication process;

FIGS. 6a and 6b illustrate cross-sectional and surface views of a second SCR implant mask;

FIG. 9a tabulates PNP and NPN bipolar gains at differing base current levels for latch-up structures made with and without a field implant;

FIG. 9b tabulates trigger and hold voltages and currents for latch-up stuctures made with and without a field implant;

FIG. 15 illustrates the relationship between the breakdown voltage and leakage current of the thick field device within the SCR structure for devices with field implants of $2E14/cm^2$ and $3E13/cm^2$.

FIG. 17 illustrates ESD results of input pads made with and without a resistor and SCE.

DETAILED DESCRIPTION OF THE PREFERRED EMBODIMENTS

The scope of the invention is defined by claims at the conclusion of the description of the preferred embodiments. However the organization, operation, advantages and objects of the invention can be more fully appreciated from the following description.

The present invention will be described in reference to a CMOS process. However, ones skilled in the art will appreciate that selecting differing dopant types and adjusting concentrations allows the invention to be applied to PMOS, NMOS and other processes that are susceptible to latch-up or damage caused by electrostatic discharge (ESD).

A typical CMOS device has wells of n and p type dopant separated by field oxide. Within an n- well, p-type source and drain regions are formed. In neighboring p-wells, n-type source and drain regions are formed. Parasitic PNPN regions thus exist throughout the circuit. If an ESD pulse injects a voltage spike into the circuit, it can cause damage to the circuit.

In the present invention, an integrated circuit is protected against ESD pulses by a thick-field silicon controlled rectifier (SCR) connected to the input and output pads. The SCR contains an NMOS thick faeld device as the SCR trigger. The term "thick field" here refers to a device in which a "thick" field oxide serves as a gate oxide. The thick-field gate oxide usually spas adjacent wells, and is an order of magnitude thicker than the gate oxides used for devices formed within a single well.

Figure 1A:
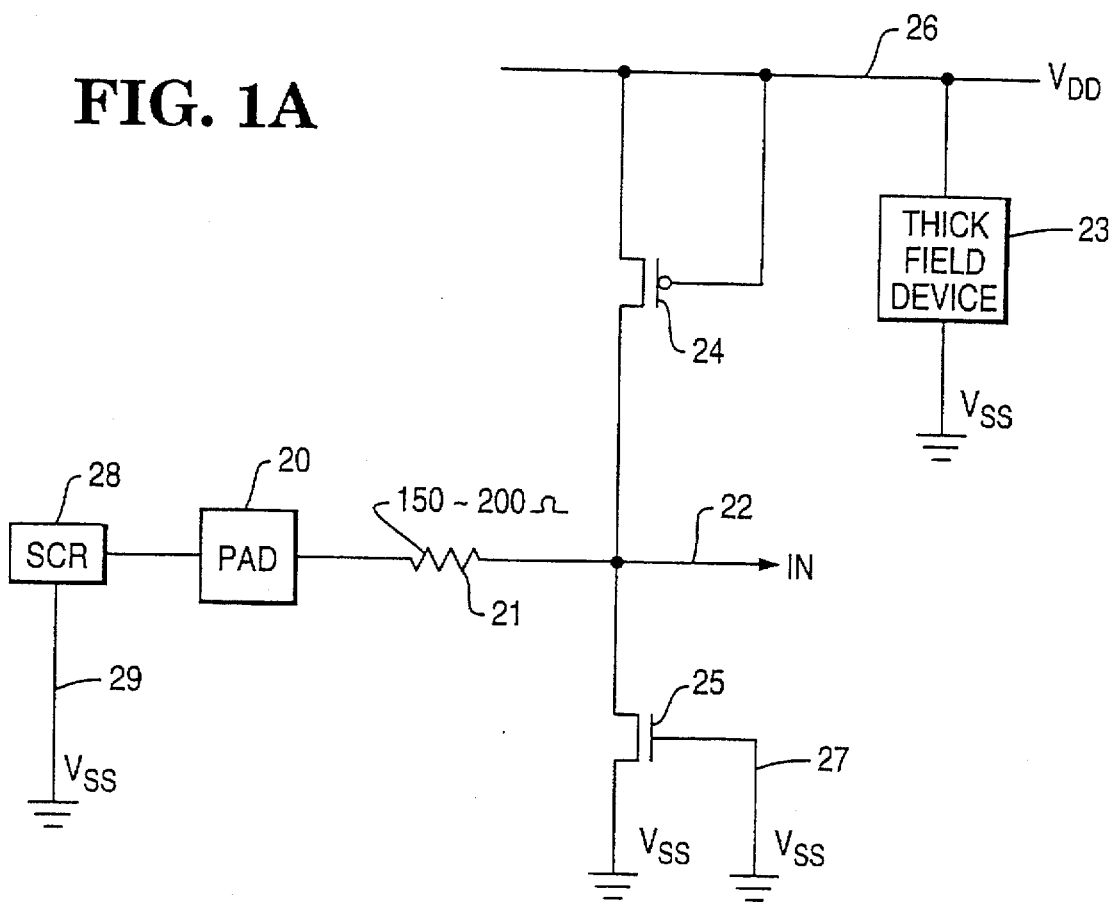
FIG. 1a illustrates a schematic diagram of a first exemplary ESD protection circuit having a SCR of the present invention.
Figure 1B:
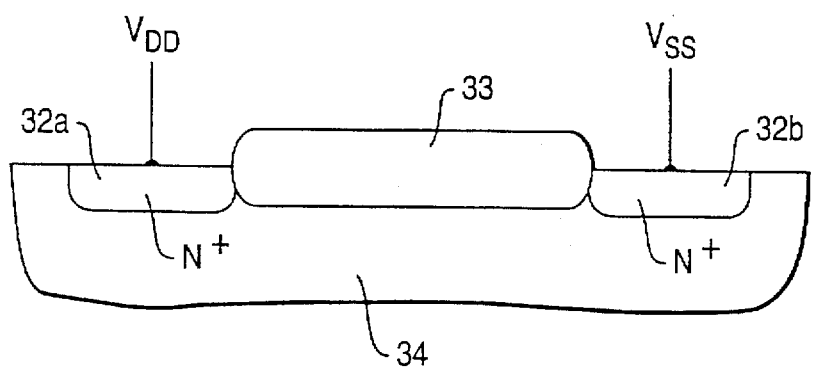
FIG. 1b illustrates a typical thick field device.

FIG. 1a illustrates a schematic diagram of a first exemplary ESD protection circuit having an SCR of the present inv ention. An input pad 20 connects through a poly-silicon resistor 21 to a IN signal line 22 which connects to other circuitry on the chip. A thick field device, 23, connects Vdd 26 to Vss to act as a return path for any ESD pulse. This device switches before the ESD pulse can damage active circuits internal to the input protection device. FIG. 1b illustrates a typical thick field device with two active n+ regions 32a,32b in a p-well 34 separated by a field oxide 33. Two transistors, one a PMOS device 24 and the other an NMOS device 25 tie the IN signal line 22 to Vdd 26 and Vss 27 connections respectively.

An SC 28 provides an independent conduction path 29 from the input pad 20 to Vss. The resistor 2 limits current flow onto the IN line 22, which in turn provides time for the SCR 28 to turn on and shunt the ESD pulse. The resistor 21 may have a resistance between one-hundred-fifty ohms and two-hundred ohms (150–200 ohms).

Figure 2:
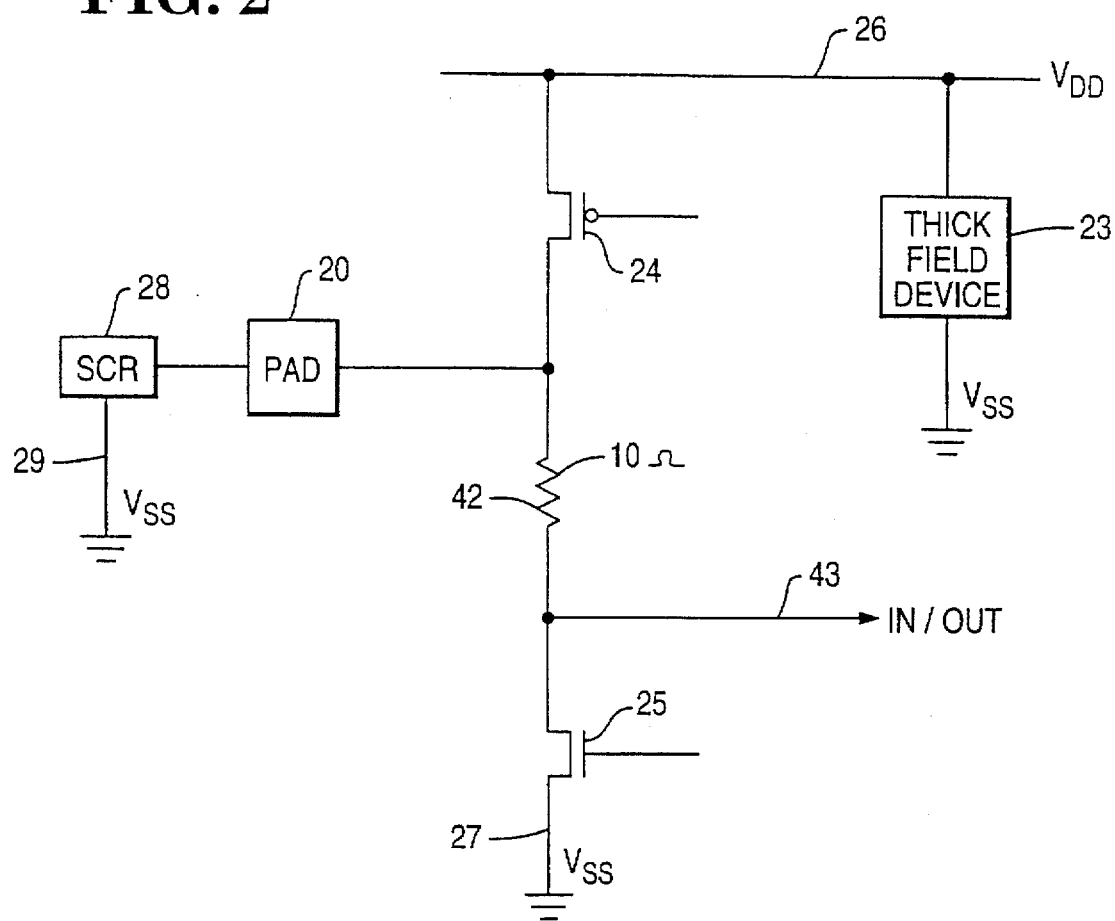
FIG. 2 illustrates a schematic diagram of a second exemplary ESD protection circuit having a SCR of the present invention.

FIG. 2 illustrates a schematic diagram of a second exemplary ESD protection circuit having an SCR of the present invention. Many of the circuit elements are identical to ones shown in FIG. 1, and elements that are the same in FIGS. 1 and 2 are designated with the same reference numerals.

An input/output pad 20 connects through a ten ohm poly-silcon resistor 42 to an IN/OUT signal line 43 which connects to other circuitry on chip. A thick field device 23 connects Vdd to Vss. Two transistors, one a PMOS device 24 and the other an NMOS device 25 tie the IN/OUT signal line 43 to Vdd 26 and Vss 27 connections respectively. An SCR 28 provides an independent conduction path 29 from the input pad 20 to Vss. TEhe resistor 42 limits current flow onto the IN line 43, which in turn provides time for the SCR 28 to turn on and shunt the ESD pulse.

Figure 3:
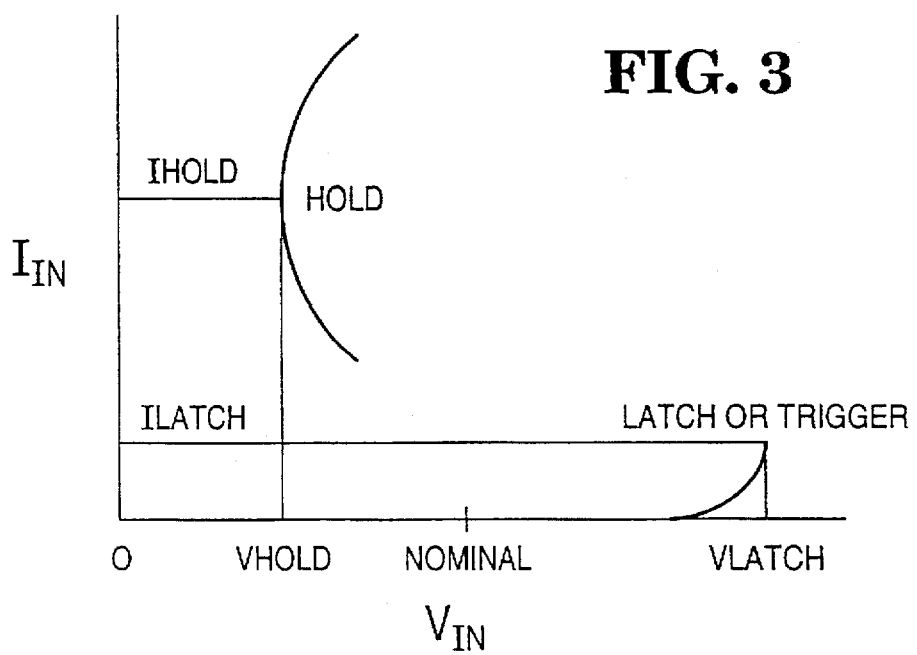
FIG. 3 illustrates a current-voltage relationship for an SCR.

FIG. 3 illustrates a current-voltage relationship for a latch-up structure of an SCR. As input voltage Vin initially increases from zero, the device is non-conducting and the operating point moves from the origin along a zero-current line. If the input pad operating voltage rises to a nominal operating voltage that is greater than Vhold but less than Vlatch, then Vin will not reach the latch voltage Vlatch and the SCR will not conduct significant amounts of current.

If, however Vin rises above the nominal voltage to the trigger voltage, then the SCR switches on and conducts current. Such a rise in Vin can be caused by an ESD pulse. Depending on characteristics of the integrated circuit, a snapback voltage may be created in the vicinity of 20 volts (for an epitaxial substrate) which can exceed the gate breakdown voltages of other devices in the circuit. The gate breakdown voltage is approximately 10 megavolts per centimeter of oxide thickness. This relates to 16 V for typical CMOS process having a gate thickness of 160Å. Above the trigger voltage, the SCR begins to conduct current. When current reaches a latch value, Ilatch, the SCR operating point transitions rapidly to the hold region. When the ESD pulse passes and Vin returns to the nominal level (at or above Vhold), the SCR will remain conducting and approach an operating point with a current at or above a minimum holding current Ihold. The device will remain "on" (conducting) until the power source is removed or drops below the holding voltage. In the region between Vhold and Vlatch, the slope of the I/V characteristics shows negative resistance. In this mode, the SCR is very efficient at conducting current without dissipating a lot of energy.

As shown in FIGS. 1 and 2, the SCR is used to protect against electrostatic discharge on an input/output line of an integrated circuit. The trigger voltage should be low enough to avoid current injection into the gates of other circuitry, but high enough to provide good rectifying junction characteristics at twice the nominal power supply voltage. When the other MOS devices on the circuit have a gate breakdown voltage of about 16 volts, and the circuit is designed for a nominal power supply voltage of about 5 volts, the SCR desirably will have a trigger voltage of about 10–13 volts, ideally about 12 volts.

Figure 4A:
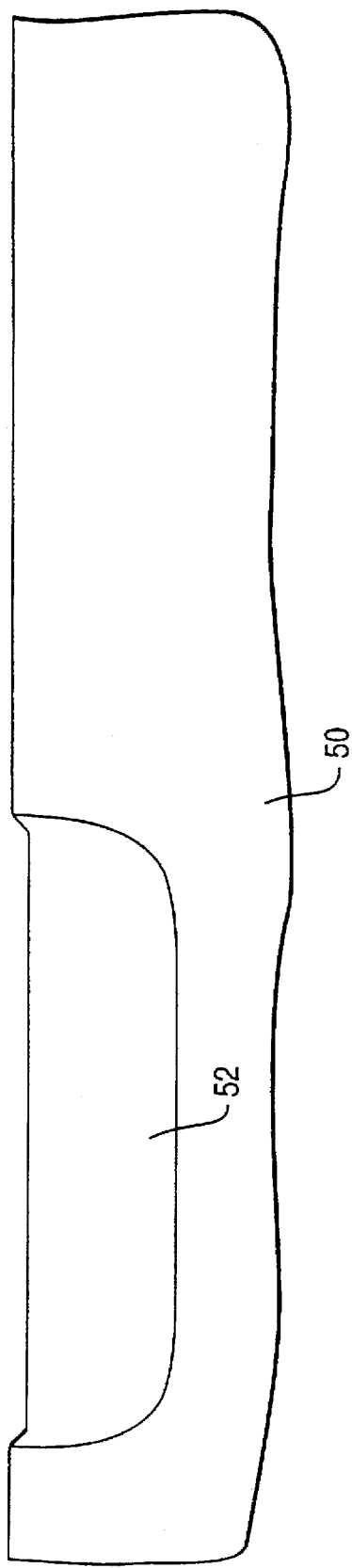

FIGS. 4a–4g illustrate cross sections of an integrated circuit SCR used in the circuits of FIGS. 1 and 2 at various points in the fabrication process. FIG. 4a illustrates a wafer having a p substrate 50 in which an n-well 52 has been formed. The wafer may be a five micron epitaxial layer doped to a concentration of about $2E15/cm^3$. The epitaxial layer is formed over a lower layer (not shown) that is intrinsically doped at a concentration of approximately $1E19/cm^3$.

Figure 4B:
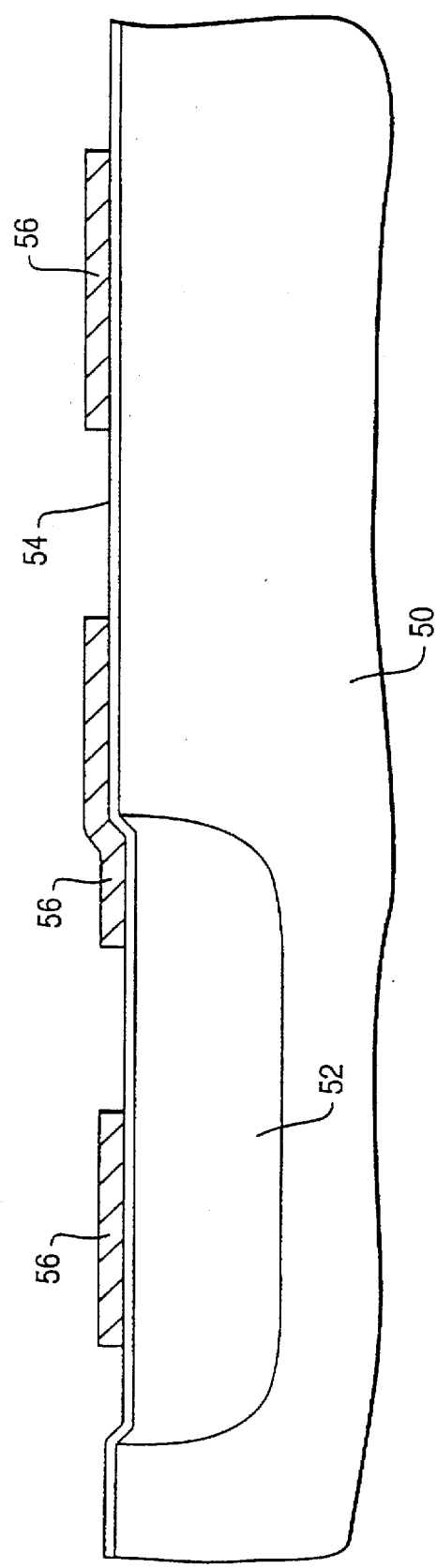

In FIG. 4b, a thin oxide layer 54 has been formed over both the substrate 50 and the well 52, and a nitride pattern 56 has been formed in a pattern over the oxide layer 54. The nitride pattern 56 leaves exposed areas which will ultimately become field oxides.

In FIG. 4c, a photo-resist mask 58 has been applied and patterned to cover the n-well, leaving exposed regions 60a, 60b that will receive a boron implant 62. These exposed regions are of two types. Regions of the first type 60a are located adjacent to n-wells and isolate devices formed within individual wells. This is a traditional field implant used to prevent field inversion. The region of the second type 60b will be used to adjust characteristics of the SCR. It is contemplated that this step will implant boron to a dose of about $3 \times 10E13/cm^2$ at an implant energy of about 40 KeV. This is a dose for a typical implant to prevent field inversion, and may be omitted when design rules permit.

In FIG. 4d, a second mask has been applied that (together with the nitride pattern 56) leaves exposed only the SCR field implant region 60b. A second boron implant 66 of about $1.7E14/cm2$ at about 40 KeV raises the SCR field implant dose to about $2E14/cm^2$. If a first implant has been omitted, then the implant dose can be increased to bring the SCR field concentration directly to the full level.

In FIG. 4e, field oxides 70 are formed in regions previously exposed by the nitride pattern 56. In order to grow such field oxides, the second mask pattern has been removed and the substrate exposed to an oxidizing atmosphere. Then, the nitride layer and the thin oxide layer are removed.

Figure 4G:
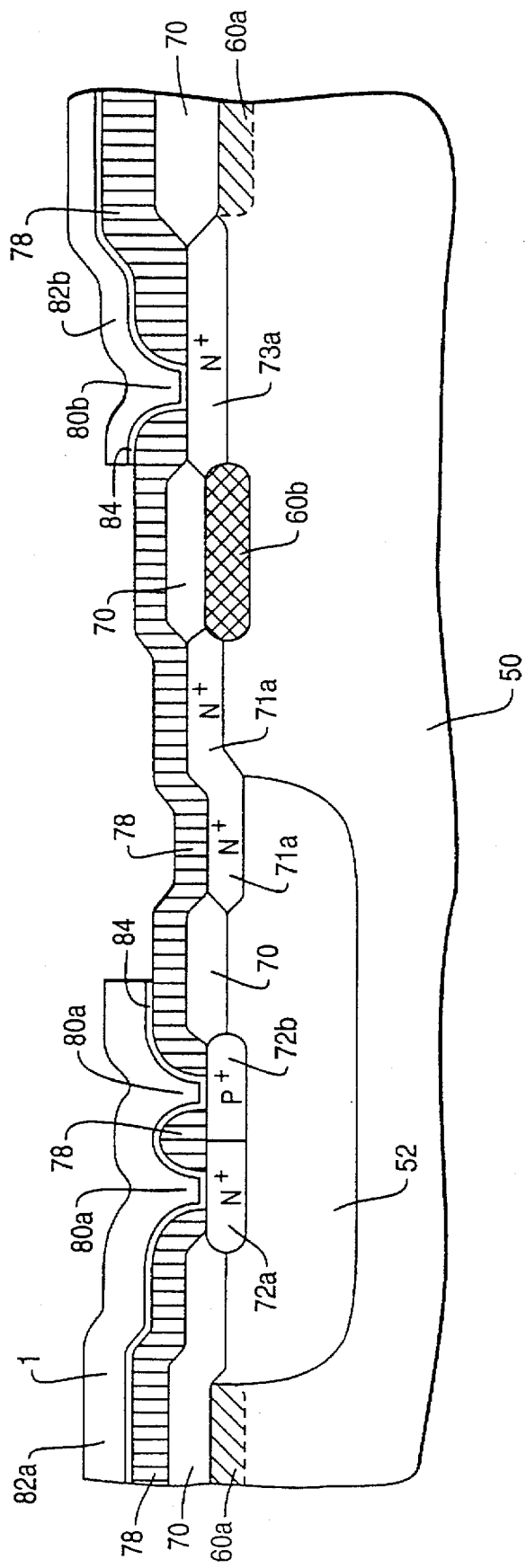

In FIG. 4f, n+ and p+ dopants have been selectively implanted to form active n+ regions 71a/72a/73a and active p+ regions 72b. Active n+ region 71a extends past the end of the n-well into the p-well, thus correct junction bypassing is maintained. The n+ region 71a acts as a low resistance path from the base of the vertical PNP into the emitter of the lateral NPN. In FIG. 4g, a borophosphosilicate glass (BPSG) layer 78 has been formed over the entire wafer, and contact holes have been formed into selected contact regions—one for a contact pad 80a and another for Vss 80b. A metal pad 82a and a metal interconnect line 82b of aluminum/silicon/copper is f ormed above the BPSG 78. In the contact holes 80, a titanium nitride barrier layer 84 is also formed. The metal interconnect line 82b is in turn connected to Vss.

The SCR is made up of the following four regions: 1) the p+ region 72b in the n-well 52 (first semiconductor region), 2) the n-well itself 52, 3) the p substrate 50 (third semiconductor region), including implanted region 60b (third semiconductor region), and 4) the n+ region 72a (fourth semiconductor region) in the p substrate 50 that is connected to metal interconnect line 80b (fourth semiconductor region). The n-well cntains both an active n+ and an active p+ region connected to the contact pad 80a. The p+ region 72b acts as a connection to the SCR, while the n+ region 72a acts as a substrate tie to bias the n-well 52 relative to the substrate 50.

The trigger for the SCR consists of a thick field NMOS device, the source and drain being region 71a/73a, the channel being region 60b and the thick field region being 70 in FIG. 4(g).

It should be understood that the intended function of the SCR is to provide a triggered conduction path between the pad and a current sink so that an ESD pulse can be dissipated without injecting energy into other parts of the circuit. Although a metal connection to Vss is contemplated, other connections to a suitable current sink structure may also be used.

Figure 5A:
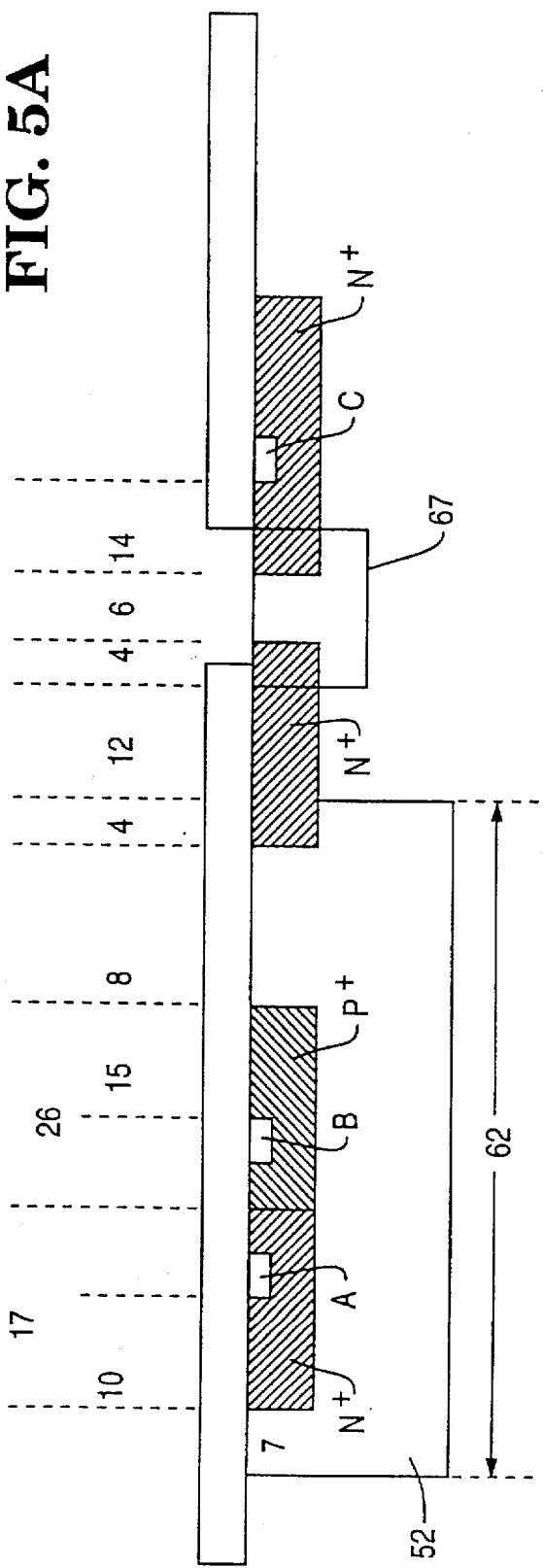
FIGS. 5a and 5b illustrate cross-sectional and surface views of a first SCR implant mask.
Figure 5B:
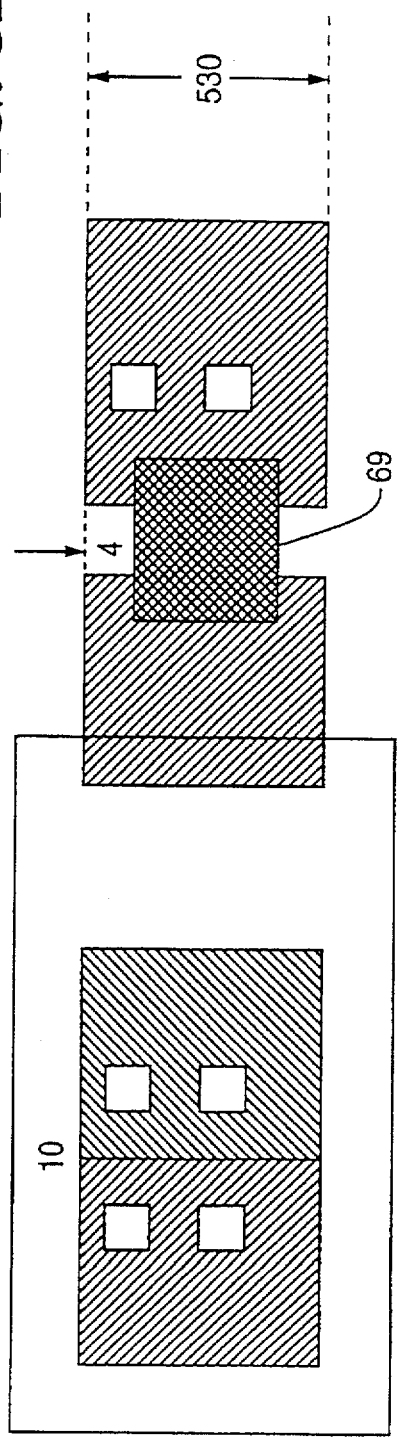

FIGS. 5a and 5b illustrate cross-sectional and surface views of a first SCR implant mask. Numerals here indicate relative dimensions in units that can be scaled. The n-well is formed to a length of 62 units. Active n+ and p+ regions in the n-well are 17 and 26 units long respectively. Metalization contact points A and B are formed in these n+ and p+ regions respectively, the n+ point A being 10 units from an outer edge, the p+ point B being 15 units from the inner edge, the two points A,B separated by 10 units. The SCR field implant 67 has a length of 34 units, and is displaced from the n-well by 12 units.

As shown in FIG. 5b, the SCR is relatively wide, having a mask 69 width of 530 units to enable the SCR to handle large peak currents during an ESD pulse. The SCR field implant need not extend the full width of the device. The device may be scaled to different dimensions to be consistent with differing design rules. One layout unit may, for example, equal an absolute length of two-tenths (0.2) of a micron. The oxide layer outlines and the BPSG layer are not shown so that the side and top view alignments are clear.

FIGS. 6a and 6b illustrate cross-sectional and surface views of a second SCR implant mask. Again, relative dimensions are shown in layout units.

An SCR without a field implant would be expected to have trigger properties similar to other thick field devices on the substrate. The field implant adjusts the SCR trigger characteristics so that the SCR will become active before the other thick field devices. The field implant differs from a traditional field implant in that the SCR field implant has a higher concentration and is formed in a device specifically created to operate as an SCR.

Figure 7:
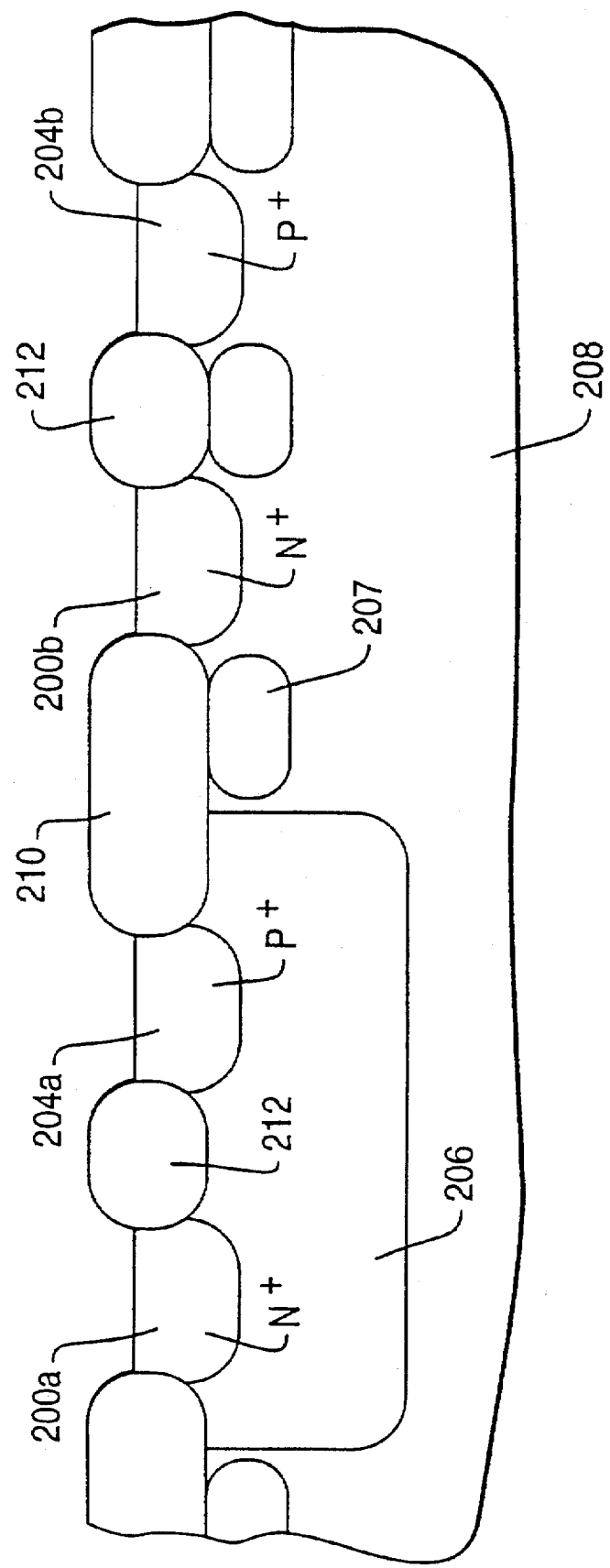
FIG. 7 illustrates a cross-section of a device for measuring the effect of a field implant on latch-up characteristics.

FIG. 7 illustrates a cross-section of a device for measuring the effect of a field implant on latch-up or SCR characteristics. The latch-up structure and SCR structure are very similar. The latch-up structure can be used to characterize the SCR. The differences between the latch-up structure and the SCR structure is that the p-well contact (204b) is left floating on the SCR and that the n+ substrate tie and p+ diffusion in the p-well are connected together in the SCR. Separated terminals are essential to characterize the bipolar components of the SCR. Active n+ and p+ regions 200a, 200b,204a,204b are formed in adjacent n– and p-wells 206,208. A first field oxide 210 separates adjacent n– and p-wells 206,208. Second field oxides 212 separate adjacent active n+ and p+ regions 200a,204a, 200b,204b. A field implant. 207 for adjusting the SCR characteristics is located beneath the first field oxide 210.

The structure shown in FIG. 7 forms a four-layer PNPN device consisting of: 1) the p+ active region 204a in the n-well, 2) the n-well itself 206, 3) the p-well (p substrate) 208, including a field implant 207, and 4) the n+ active region 200b in the p-well. Thought of another way, the structure forms a vertical PNP transistor coupled to a lateral NPN transistor. The vertical PNP device consists of: 1) the p+ active region 204a in the n-well which acts as an emitter, 2) the n-well itself 206 which acts as a base, and 3) the p substrate (p-well) 208 which acts as a collector. The lateral NPN device consists of: 1) the n+ active region 200b in the p-well which acts as an emitter, 2) the p-well (substrate) itself 208 which acts as a base, and 3) the n-well 206 which acts as a collector.

As the field implant dose increases and the concentration under the field region increases, the following happens:

1) the breakdown voltage at the junction between the n+ 200b and the p substrate decreases, which in turn decreases the latch-up trigger voltage;
2) the gain of the NPN transistor decreases, which in turn increases latch-up trigger current; and
3) holding voltage and holding current increase due to the decreased NPN gain.

These all lead to an SCR that will trigger before other field devices on the circuit, and an SCR with improved current shunting capacity.

A device as shown in FIG. 7 can be tested for SCR characteristics by connecting the active regions in the n-well 200a,204a to a Vdd level (power source) and by connecting the active regions in the p-well 200b,204b to a Vss level (ground relative to Vdd). Test results for a lot of prototypes doped with four field implant concentrations are presented in FIGS. 8–15. Although the precise levels of the measurements may vary for differing manufacturing processes, the figures illustrate the trends that result from varying implant doses.

Figure 8:
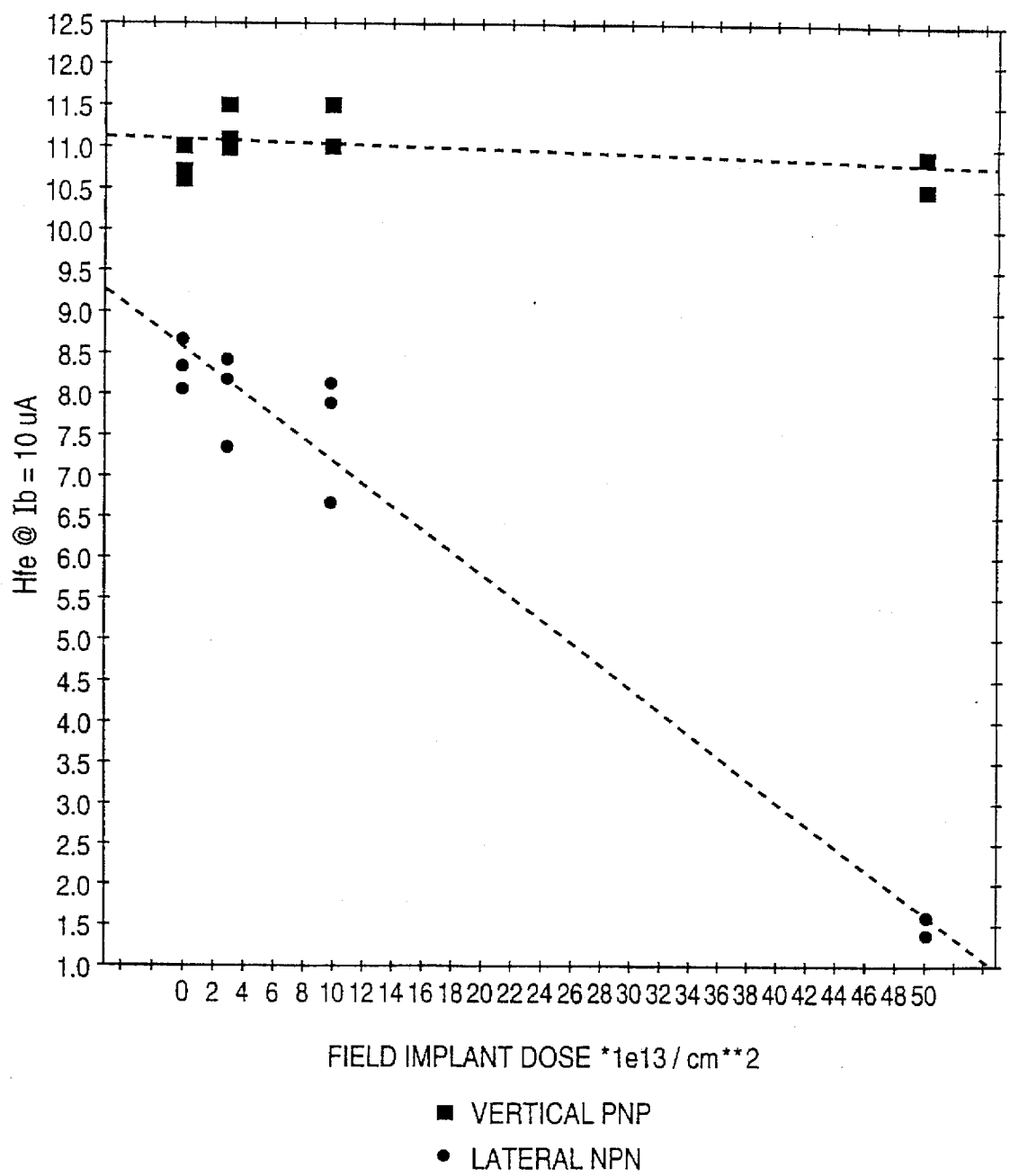
FIG. 8 illustrates a relationship between field implant dose and bipolar gain for NPN and PNP devices within an SCR.

FIG. 8 illustrates a relationship between bipolar gain of the vertical and lateral devices. Four field implant doses were used, with doses ranging from no dose to $5E14/cm^2$. Gain measurements (Hfe) for the vertical devices are shown as square data points, while gain measurements for the lateral devices are shown as round. Base current was 10 micro-amperes. The gain diminished significantly for the lateral devices, while the gain for the vertical devices was relatively unaffected. This reduction in lateral device gain could be used to reduce the susceptability of a device to latch-up. Latch-up is related to the product of the gains of the vertical PNP and horizontal NPN devices. This would be realized by implanting a ring of high dose field implant around the n-well of a latch-up sensitive device.

FIG. 9a compares vertical and lateral device gains for prototypes without field implants and devices having field implant doses of $5E14/cm^2$. The gains were measured for 5 ma and 20 ma base currents, which are levels more typical during latch-up. The field implant reduced the lateral NPN gain in both cases. Additionally, the product of vertical and lateral gains, which is a good indicator of latch-up sensitivity, decreased.

FIG. 9b tabulates bipolar gains, trigger current and voltage, and hold current and voltage for test devices with no field implant and for devices with an implant of $3E13/cm^2$. The dose of $3E13/m^2$ is a typical field implant does, and has relatively little affect on SCR characteristics. Thus, a field implant for SCR characteistics may be distinguished from traditional field implants.

Figure 10:
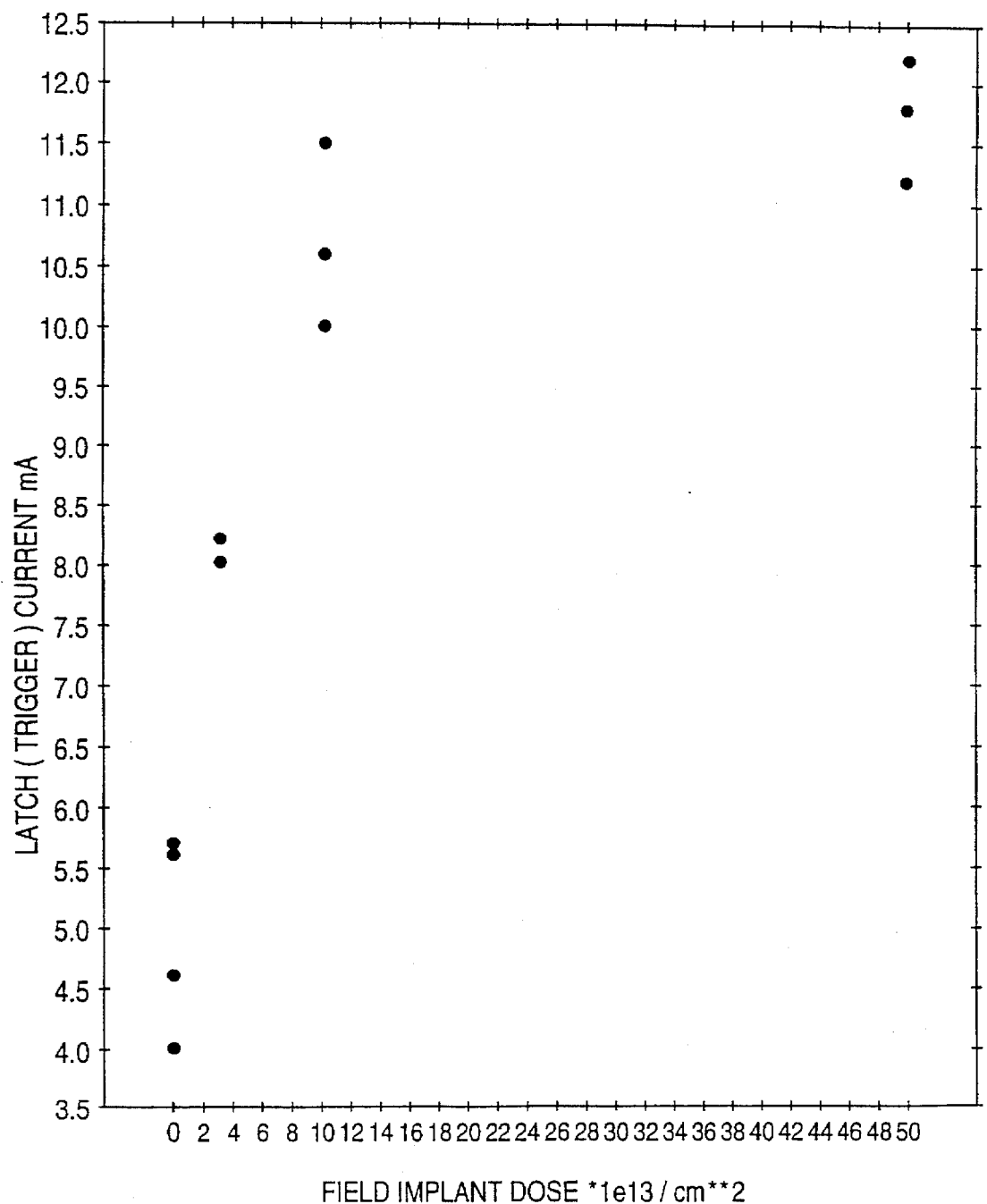
FIG. 10 illustrates a relationship between field implant dose and trigger current for catch-up structures made with varying field implant concentrations.

FIG. 10 illustrates an increase in latch-up trigger current as a function of increasing field implant concentration.

Trigger current increases because the gain of the lateral NPN is reduced. More base current is required to keep the lateral NPN turned on. It can be seen that the marginal increase in trigger current is relatively small for doses above $3E13/cm^2$, especially for doses above $1E14/cm^2$. Thus, much of the trigger-current benefit of the field implant is available for doses above $1E14/cm^2$.

Figure 11:
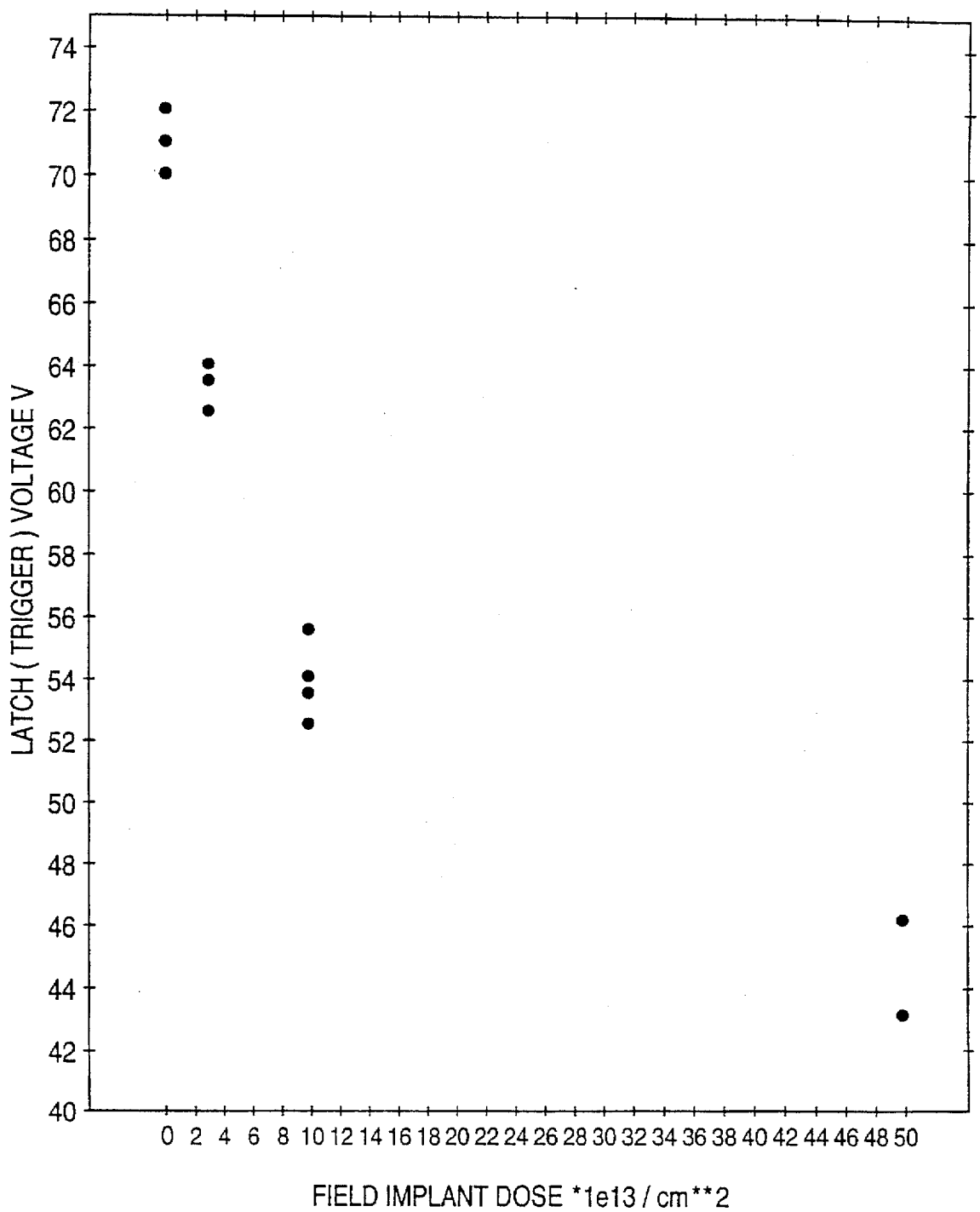
FIG. 11 illustrates a relationship between field implant dose and trigger voltage for latch-up structures made with varying field implant concentrations.

FIG. 11 illustrates a reduction in trigger voltage as a function of increasing field implant concentration. For the two-terminal test structure, a breakdown at the p-well-to-n-well junction triggers latch-up. The increase in concentration in the p-well under the field reduces the junction breakdown voltage and thus lowers the trigger voltage. Again, an improved latch-up characteristic can be achieved with a field implant dose above 3E13, best above $10E13/cm^2$ ($1E14/cm^2$).

Figure 12:
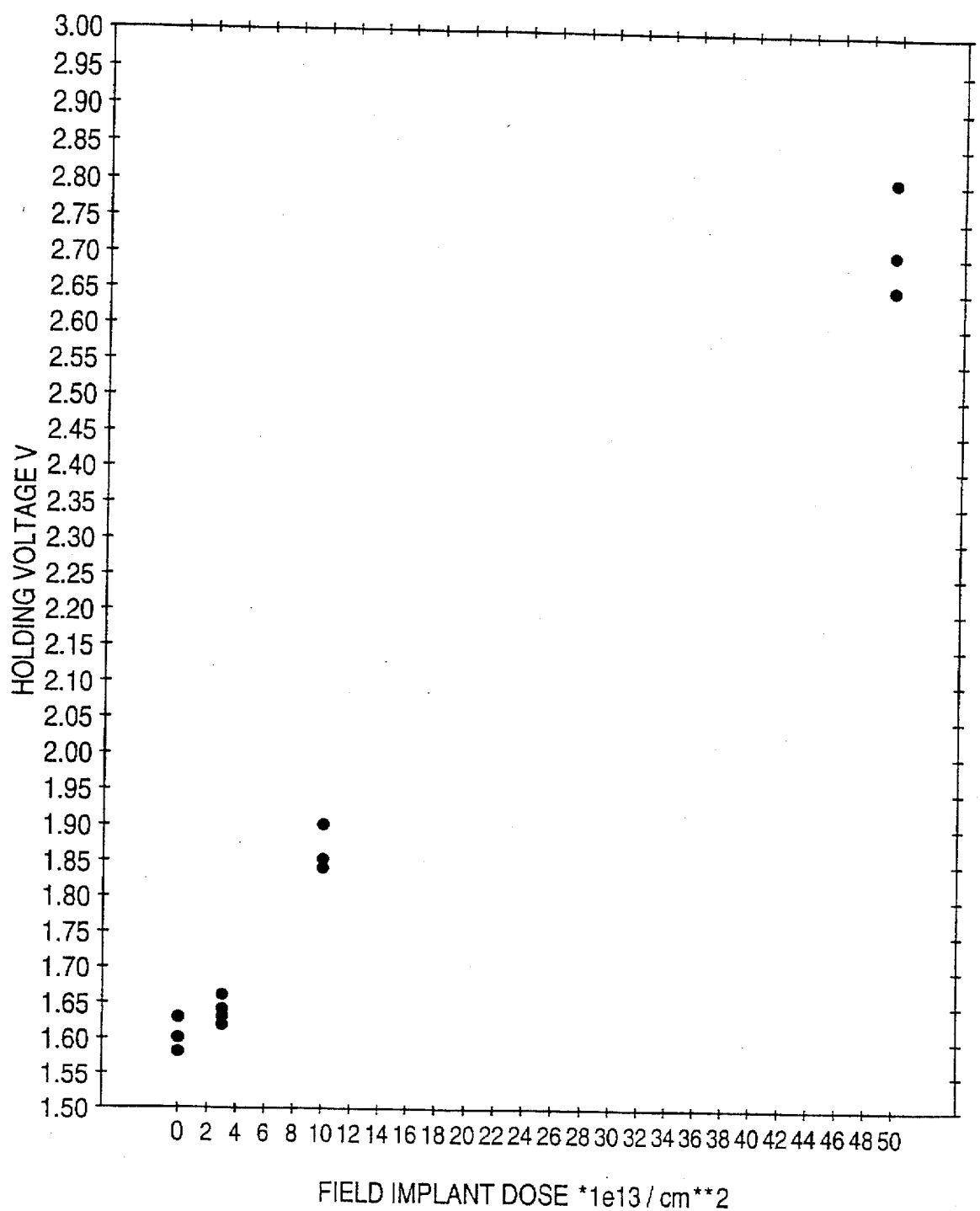
FIG. 12 illustrates a relationship between field implant dose and holding voltage for latch-up structures made with varying field implant concentrations.
Figure 13:
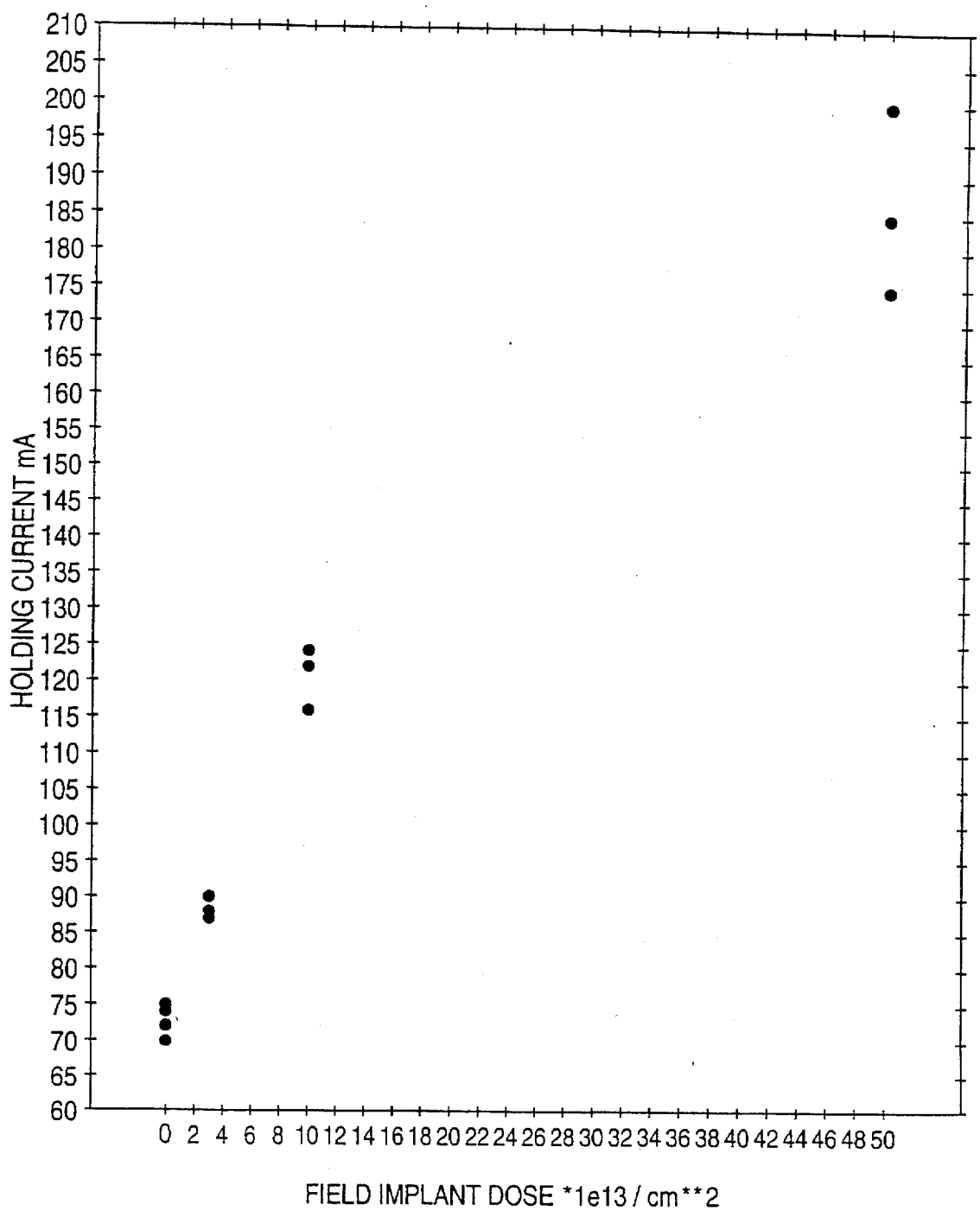
FIG. 13 illustrates a relationship between field implant dose and holding current for latch-up structures made with varying field implant concentrations.

FIGS. 12 and 13 illustrate an increase in holding voltage and holding current respectively as functions of increasing field implant concentrations. Increasing the field implant concentration decreases lateral NPN gain which, in turn, necessitates more current to sustain the latched state.

Figure 14:
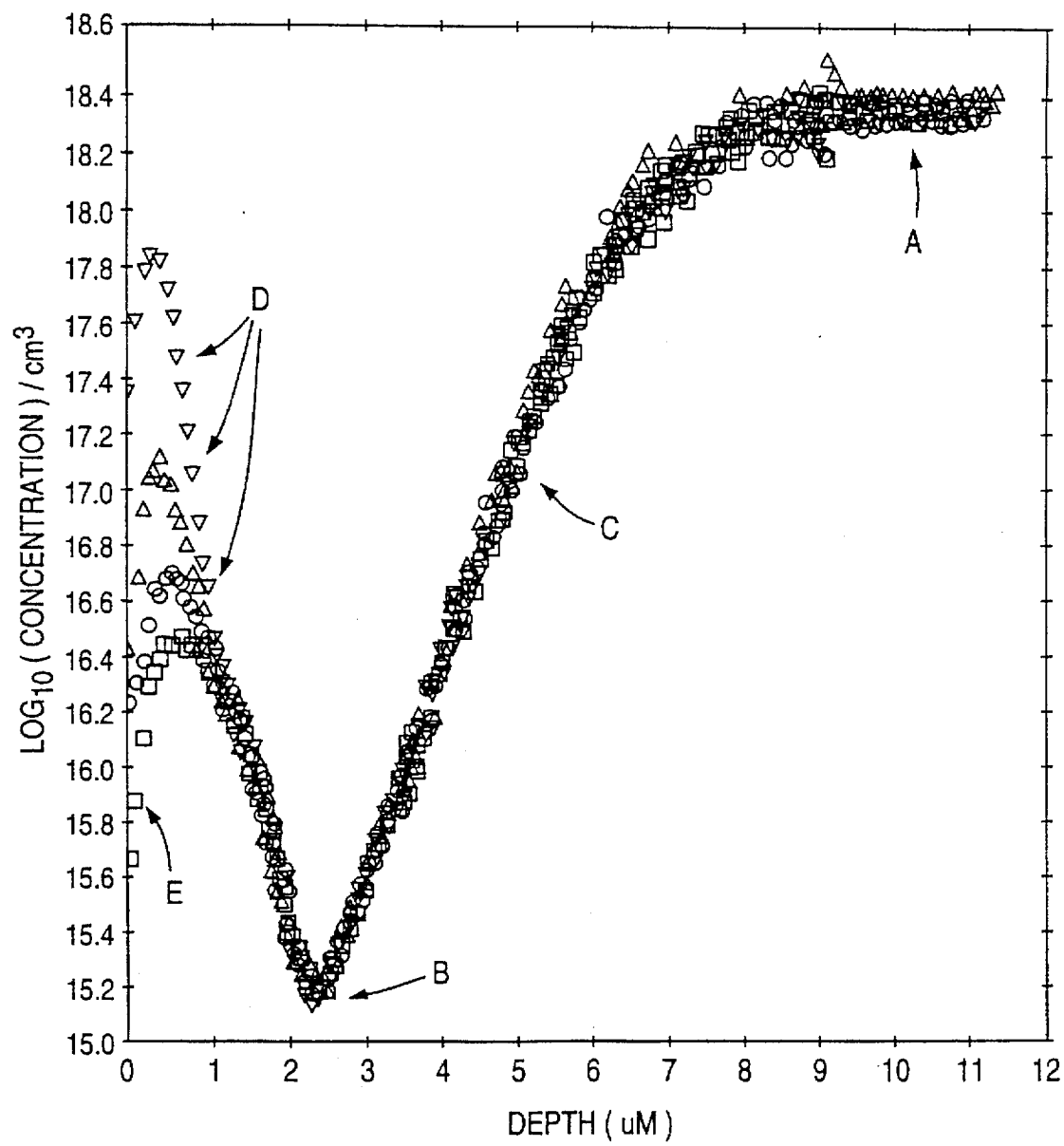
FIG. 14 illustrates the relationship between depth into the silicon versus log 10 (concentration) for p-well field structures made with varying field implant conditions extending from the field oxide/silicon interface, through the field implant and p-well, through the epitaxial/substrate transition region and into the substrate.

FIG. 14 illustrates concentration profiles for four devices having varied SCR field implant concentrations. Concentrations were measured by sectioning a prototype device at an angle relative to the plane of the wafer and measuring resistance with a four-point probe. Concentration was correlated with resistance and normalized by plotting the base-ten logarithm of concentration.

For each of the four tested prototypes, the profile shows concentration of p type dopant at depths ranging from the surface of the wafer (immediately below the field oxide) into the substrate. A profile for a device with no implant is plotted as square data symbols. A round symbol represents a device implanted at a $3E13/cm^2$ concentration. Triangles, point-up and point-down, correspond to concentrations of $1E14/cm^2$ and $5E14/cm^2$ respectively.

Each of the four prototypes was fabricated with an epitaxial layer above a highly-doped p-type substrate. In FIG. 14, Region A corresponds to the highly doped substrate, where concentrations are in the vicinity of $2E18/cm^3$. Region B, centered at a depth of about 2.3 microns, corresponds to the epitaxial layer, where concentration is in the vicinity of $1.3E15/cm^3$. Region C reflects a transition region in which dopant diffuses from the highly doped substrate into the epitaxial layer. Region D corresponds to field implants in accordance with the present invention.

The field implant raises dopant concentration at depths of less than about one micron. The square symbols show a concentration of about $2.5E16/cm^3$, which reflects a standard concentration for all p-well s on the wafer. Field implants of 3E13, 1E14 and 5E14 raise the concentration peak to about 5E16, 1.2E17 and $6E17/cm^3$ respectively.

Region E corresponds to very shallow depths of less than one-half micron below the field oxide. In this region, the dopant concentration decreases due to segregation diffusion into the field oxide during field oxide growth and subsequent diffusion steps.

FIG. 15 tabulates measurements on Lateral NPN leakage current and breakdown voltage for thirty test devices with an SCR field implant of $2E14/cm^2$ and for thirty test devices with an implant of $3E13/cm^2$. The mean breakdown voltage, which corresponds to SCR trigger voltage, is reduced from 15.4 volts to about 10.6 volts (measured at 1 microamp). Mean leakage current increased from 0.29 picoamps to 1.81 picoamps (measured at 5 v).

Figure 16:
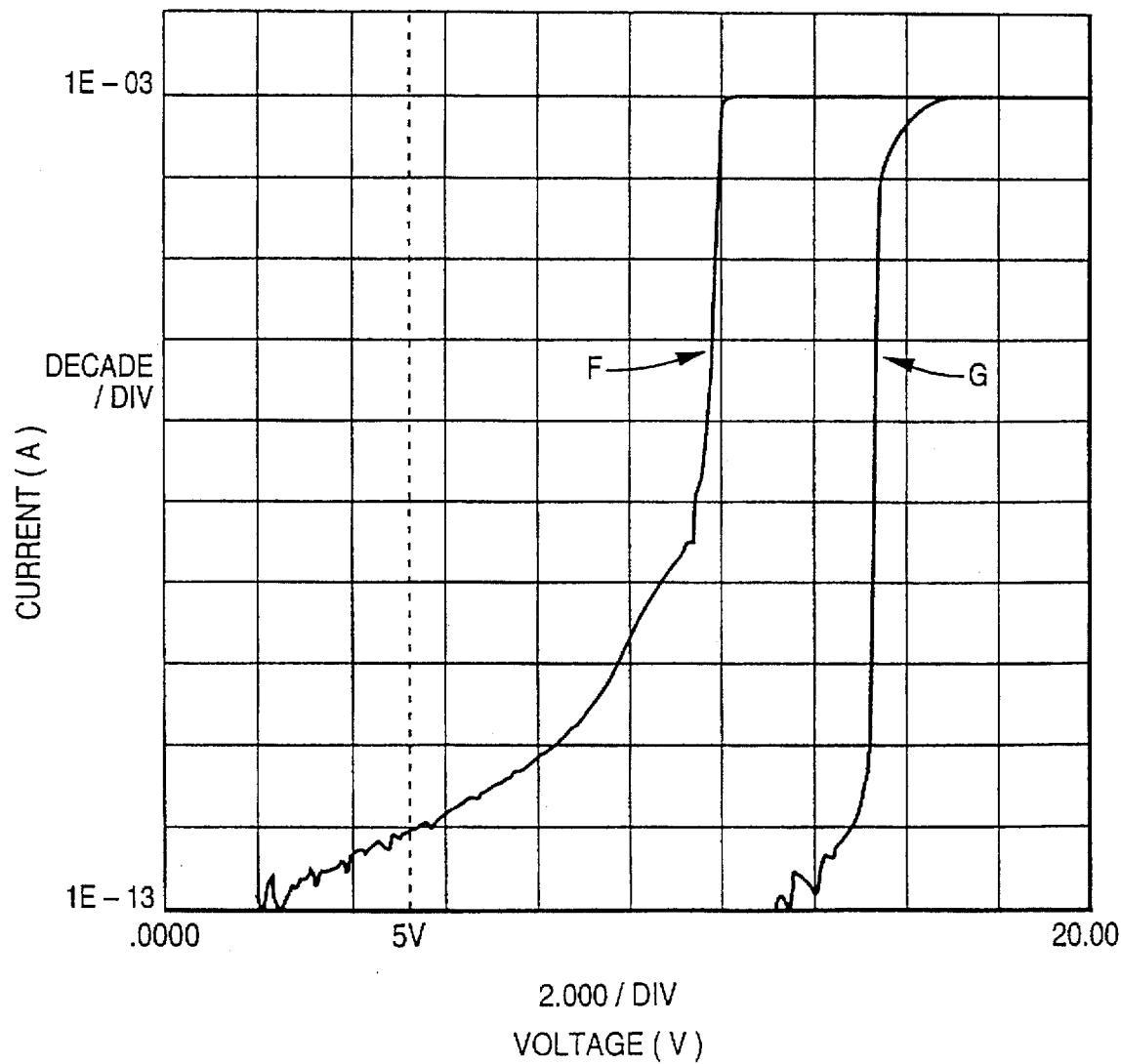
FIG. 16 illustrates the current/voltage characteristics of the thick field device within the SCR structure for devices illustrated in FIGS. 6a and 6b with field implants of $2E14/cm^2$ and $3E13/cm^2$.

FIG. 16 illustrates triggering of two SCR devices. Current is shown as a function of voltage over a range from zero to 20 volts. Region F reflects a sharp increase in current at about 11.8 volts that corresponds to triggering of an SCR with a $2E14/cm^2$ field implant. Region G reflects triggering of an SCR with a $3E13/cm^2$ field implant. Raising the field implant lowers SCR trigger voltage.

FIG. 17 tabulates ESD results of input pads made with and without a polysilicon resistor and an SCR. For tests on 279 devices without the resistor and SCR, eight failed at 1000 volts, 21 failed at 1500 volts, and an additional 4 failed at 2000 volts. For devices with the resistor and SCR, none failed at 2000 volts or less, and only 2 failed at 4000 volts. This clearly demonstrates the improvement in ESD margin with SCR and resistor.

Although a field implant can impart desirable characteristics to an SCR, an increased field implant above $3E13/cm^2$ in the vicinity of smaller device structures may degrade device characteristics. Such potentially adversely affected devices include MOS transistors with a gate oxide on the order of 200 angstroms (as compared to a thick field oxide on the order of 5000 angstroms) or transistors having both a length and width on the order of one micron (as compared to a thick field device having at least one dimension on the order of 10 microns). In these devices, the gate threshold voltage may be reduced, the effective channel width may be shortened, and the source/drain junction capacitance may be increased. These effects may result from diffusion of field implant into the active region.

After learning of the embodiments described above, people practicing in this art will be able to make variations that fall within the spirit and scope of the invention. The embodiments described above are exemplary but not intended to limit unduly the scope of the invention as deemed by the following claims.

What is claimed is:

1. An integrated circuit formed on a semiconductor substrate comprising:
    a contact pad for communicating a signal between an external device and a signal line of the integrated circuit;
    a first semiconductor region with a first concentration of a first dopant type connected to the pad;
    a second semiconductor region with a second concentration of a second dopant type forming a first junction with the first region;
    a third semiconductor region with a third concentration of the first dopant type forming a second junction with the second region and including a subregion; and
    a fourth semiconductor region with a fourth concentration of the second dopant type forming a third junction with the third region and the subregion and connected to a current sink;
    said first, second, third and fourth regions functioning as a silicon controlled rectifier;
    the subregion having an increased concentration of dopant greater than the third semiconductor region, thereby providing a lowered threshold voltage of the silicon controlled rectifier.

2. An integrated circuit formed on a semiconductor substrate comprising:
    metal oxide semiconductor devices having at least one characteristic gate breakdown voltage;
    a contact pad for communicating a signal between an external device and a signal line of the integrated circuit;
    a first semiconductor region with a first concentration of a first dopant type connected to the pad;

a second semiconductor region with a second concentration of a second dopant type forming a first junction with the first region;

a third semiconductor region with a third concentration of the first dopant type forming a second junction with the second region, the third semiconductor region including a subregion having a concentration higher than the third semiconductor region; and a fourth semiconductor region with a fourth concentration of the second dopant type forming a third junction with the third region and the subregion and connected to a current sink;

said first, second, third and fourth regions functioning as a silicon controlled rectifier having a trigger voltage less than the at least one characteristic gate breakdown voltage, said trigger voltage is lowered by the subregion.

3. The circuit of claim 1 wherein the second region comprises an n-well.

4. The circuit of claim 2 wherein the subregion includes an increased dopant concentration between about $1E17/cm^3$ and about $1E18/cm^3$.

5. The circuit of claim 2 further comprising a connection between the contact pad and the second semiconductor region for biasing the second junction between the second semiconductor region and the third semiconductor region.

6. The integrated circuit of claim 2 wherein the integrated circuit is coupled to receive a supply voltage and the trigger voltage is greater than the supply voltage.

7. The circuit of claim 2 further comprising a fifth semiconductor region forming a fourth junction with the second semiconductor region and a fifth junction with the subregion.

* * * * *